(12) United States Patent
Takahashi

(10) Patent No.: US 7,038,987 B2
(45) Date of Patent: May 2, 2006

(54) OPTICAL DISK DEVICE

(75) Inventor: Hidemi Takahashi, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 784 days.

(21) Appl. No.: 10/263,343

(22) Filed: Oct. 3, 2002

(65) Prior Publication Data

US 2003/0086348 A1 May 8, 2003

(30) Foreign Application Priority Data

Oct. 3, 2001 (JP) ............................. 2001-307751

(51) Int. Cl.
*G11B 11/03* (2006.01)
(52) U.S. Cl. ................. 369/53.34; 369/47.28
(58) Field of Classification Search ............. None
See application file for complete search history.

(56) References Cited

U.S. PATENT DOCUMENTS

| | | | | |
|---|---|---|---|---|
| 6,104,682 A | * | 8/2000 | Konishi | 369/44.34 |
| 6,683,830 B1 | * | 1/2004 | Eom | 369/44.13 |
| 6,757,239 B1 | * | 6/2004 | Minamino et al. | 369/275.4 |

FOREIGN PATENT DOCUMENTS

JP  11-16295  1/1999

* cited by examiner

*Primary Examiner*—Paul W. Huber
(74) *Attorney, Agent, or Firm*—Steptoe & Johnson LLP

(57) ABSTRACT

It is a subject to provide an optical disc device which can speedily control generation of a data sync clock, when the position of data reading by an optical pickup shifts between a data unrecorded area and a data recorded area.

An optical disc device comprises a first wobble cycle counter 702 for counting the cycle of a wobble reference signal S104 that is synchronized with a wobble signal S101 obtained from an optical disc, with a constant cycle clock S102; a second wobble cycle counter 703 for counting the cycle of the wobble reference signal S104 with a data sync clock S103; a count value comparator 704 for obtaining a difference between a count value outputted from the first wobble cycle counter 702 and a count value outputted from the second wobble cycle counter 703; and a comparison result judgement unit 710 for judging whether or not the value of a count value comparison result that is output from the count value comparator 704 is within a range of preset values. Therefore, when a position where information is read by an optical pickup shifts between a data unrecorded area and a data recorded data, generation of the data sync clock can be speedily controlled.

8 Claims, 14 Drawing Sheets

OPTICAL DISK DEVICE

TECHNICAL FIELD OF THE INVENTION

The present invention relates to optical disc devices and, more particularly, to an optical disc device which can speedily control generation of a data sync clock.

BACKGROUND ART

On an optical disc, a groove that waves at a constant frequency is carved on a track, and an optical disc device can calculates an absolute address on the optical disc by counting waves (wobbles) of the groove even in a state where sectors are not allocated on the optical disc. Further, in a common optical disc device, rotation of an optical disc is controlled with reference to a wobble signal obtained from wobbles.

FIG. 6 is a block diagram illustrating a simplified construction of a conventional optical disc device that is disclosed in, for example, Japanese Published Patent Application No.Hei.11-16295. The optical disc device shown in FIG. 6 is provided with an optical pickup 2, a spindle motor 3, a wobble signal detector 4, a first PLL circuit 5, a control circuit 6, a reproduction signal detector 7, and a second PLL circuit 8.

The wobble signal detector 4 takes a wobble signal from an output signal of the optical pickup 2. The first PLL (Phase Locked Loop) circuit 5 receives a wobble signal S101 outputted from the wobble signal detector 4, and generates a wobble reference signal S104 that is synchronized with the wobble signal S101. The control circuit 6 controls the spindle motor 3 which rotates the optical disc 1 so that the frequency and phase of the wobble reference signal S104 take predetermined values.

The reproduction signal detector 7 takes a reproduction signal (analog signal) from data recorded on the optical disc 1, binarizes the reproduction signal to generate an RF envelope signal S110, and outputs the RF envelope signal S110 to a demodulator (not shown). Further, when it is detected from the reproduction signal that there is a blemish on the optical disc 1, the reproduction signal detector 7 outputs a blemish detection signal S118 to the second PLL circuit 8. The second PLL circuit 8 generates a data sync clock S103 using the RF envelope signal S110. The data sync clock S103 is input to the demodulator as an operation clock. Hereinafter, the construction and operation of the second PLL circuit 8 will be described in detail with reference to FIG. 7.

As shown in FIG. 7, the second PLL circuit 8 is provided with a charge pump controller 801, a charge pump 802, a filter 803, and a VCO (Voltage-Controlled Oscillator) 804. The charge pump controller 801 outputs a charge pump control signal S201 for controlling the charge pump 802, on the basis of the RF envelope signal S110 and the data sync clock S103 outputted from the VCO 804. The charge pump 802 outputs a first VCO control signal S202 that determines an oscillation frequency of the VCO 804, on the basis of the charge pump control signal S201. The filter 803 removes, from the first VCO control signal S202, noise components that are not needed for oscillation of the VCO, and outputs a second VCO control signal S203. The VCO 804 outputs the data sync clock S103 having an oscillation frequency corresponding to the second VCO control signal S203. Through the above-mentioned operation, the second PLL circuit 8 can output the data sync clock S103 whose phase and frequency are matched to the phase and frequency of the RF envelope signal S110. On the other hand, when the charge pump controller 801 receives the blemish detection signal S118 from the reproduction signal detector 7, the charge pump controller 801 generates a charge pump control signal S201 on the basis of only the data sync clock S103 outputted from the VCO8, and outputs it to the charge pump 802. Thereby, the second PLL circuit 8 goes into the hold state, and it can output the data sync clock S103 while maintaining the state, without matching the phase and frequency of the data sync clock S103 to the phase and frequency of the RF envelope signal S110.

PROBLEMS TO BE SOLVED BY THE INVENTION

Hereinafter, a description will be given of problems that occur when the above-mentioned conventional optical disc device generates a data sync clock.

A predetermined amount of data is recorded in every predetermined area on the optical disc 1, and arrangement of data on the optical disc 1 is not necessarily continuous. Accordingly, a data-unrecorded area where no data is recorded exists on the optical disc 1. Thereby, the reproduction signal obtained from the optical disc 1 becomes an intermittent signal including a non-signal period during which no data exists. Although the information outputted from the optical pickup 2 during the non-signal period includes no data, it includes noises as follows: disc noise under the unrecorded state, optical noise of a semiconductor laser as a light beam for playback, amplifier noise that is generated in the reproduction signal detector 7, and the like. Therefore, when the second PLL circuit generates a data sync clock using the RF envelope signal including these noises, the frequency of the data sync clock fluctuates significantly. In the conventional optical disc device, when the position where data are being read by the optical pickup 2 shifts-from the data-unrecorded area to the data-recorded area, the second PLL circuit 8 tries to pull the oscillation frequency to the correct frequency that is synchronized with the reproduction signal. However, if the frequency of the data sync clock S103 significantly fluctuates during the period of data reading from the data-unrecorded area, a pull-in time required for the oscillation frequency to be synchronized with the correct frequency (i.e., a time required until synchronization is established) is increased, resulting in an increase in data reading errors.

The present invention is made to solve the above-described problems and has for its object to provide an optical disc device which can speedily control generation of a data sync clock when the position of data reading by an optical pickup shifts between a data-unrecorded area and a data-recorded area.

MEASURES TO SOLVE THE INVENTION

An optical disc device according to the present invention (claim 1) comprises a first wobble cycle counter for receiving a wobble reference signal that is synchronized with a wobble signal obtained from wobbles on tracks of an optical disc, and a clock of a constant cycle, and counting the cycle of the wobble reference signal with the constant-cycle clock; a second wobble cycle counter for receiving the wobble reference signals, and a data sync clock that is synchronized with data obtained from the optical disc, and counting the cycle of the wobble reference signal with the data sync clock; a comparator for deriving a difference between a count value outputted from the first wobble cycle counter and a count value outputted from the second wobble cycle counter; and a comparison result judgement unit for judging whether the difference of the count values obtained by the comparator is within a range of preset values or not, and outputting a judgement result indicating whether the data sync clock fluctuates or not.

The optical disc device according to claim 1 of the present invention can accurately detect whether an area on an optical disc in which an optical pickup is reading data is a data recorded area or a data unrecorded area, and it can speedily control generation of a data sync clock, on the basis of detection of the data unrecorded area, when the position of data reading by the optical pickup shifts between the data recorded area and the data unrecorded area.

Further, according to the present invention (claim 2), the optical disc device as defined in claim 1 further comprises a continuous state judgement unit for comparing the judgement results outputted from the comparison result judgement unit, at every continuous cycle of the wobble reference signal, to judge whether the judgement result outputted from the comparison result judgement unit is a temporary one or a continuous one.

The optical disc device according to claim 2 of the present invention can reduce judgement errors due to temporary fluctuation of the judgement result obtained by the comparison result judgement unit when detecting the data unrecorded area, thereby performing highly-accurate detection of the data unrecorded area. Further, it can speedily control generation of the data sync clock on the basis of detection of the data unrecorded area, when the position of data recording by the optical pickup shifts between the data unrecorded area and the data recorded area.

Further, according to the present invention (claim 3), the optical disc device as defined in claim 1 further comprises a wobble cycle judgement unit for comparing the count values outputted from the first wobble cycle counter, at every continuous cycle of the wobble reference signal, to detect whether the wobble reference signal fluctuates or not.

The optical disc device according to claim 3 of the present invention can reduce judgement errors due to fluctuation of the wobble reference signal when detecting the data unrecorded area, thereby performing highly-accurate detection. Further, it can speedily control generation of the data sync clock on the basis of detection of the data unrecorded area, when the position of data recording by the optical pickup shifts between the data unrecorded area and the data recorded area.

Further, according to the present invention (claim 4), the optical disc device as defined in claim 2 further comprises a wobble cycle judgement unit for comparing the count values outputted from the first wobble cycle counter, at every continuous cycle of the continuous wobble reference signal, to detect whether the wobble reference signal fluctuates or not.

The optical disc device according to claim 4 of the present invention can reduce judgement errors due to fluctuation of the wobble reference signal when detecting the data unrecorded area, thereby performing highly-accurate detection. Further, it can speedily control generation of the data sync clock on the basis of detection of the data unrecorded area, when the position of data recording by the optical pickup shifts between the data unrecorded area and the data recorded area.

Further, according to the present invention (claim 5), the optical disc device as defined in claim 1 further comprises a sync code detector for detecting a sync code from the data read from the optical disc; and a data sync state detector for detecting whether the sync code detected by the sync code detector is inputted for every constant data length or not, by using the data sync clock, outputting a detection result indicating that a signal is being read from an area where data are recorded, when the sync code is inputted for every constant data length, and outputting a detection result indicating that a signal is being read from an area where data are not recorded, when the sync code is not inputted for every constant data length.

The optical disc device according to claim 5 of the present invention judges whether the area where data are being read by the optical pickup is the data recorded area or the data unrecorded area, according to whether or not a sync code is periodically detected from a signal read from the optical disc when detecting the data unrecorded area, thereby performing highly-accurate detection of the data unrecorded area. Further, it can speedily control generation of the data sync clock on the basis of detection of the data unrecorded area, when the position of data recording by the optical pickup shifts between the data unrecorded area and the data recorded area.

Further, according to the present invention (claim 6), the optical disc device as defined in claim 2 further comprises a sync code detector for detecting a sync code from the data read from the optical disc; and a data sync state detector for detecting whether the sync code detected by the sync code detector is inputted for every constant data length or not, by using the data sync clock, outputting a detection result indicating that a signal is being read from an area where data are recorded, when the sync code is inputted for every constant data length, and outputting a detection result indicating that a signal is being read from an area where data are not recorded, when the sync code is not inputted for every constant data length.

The optical disc device according to claim 6 of the present invention judges whether the area where data are being read by the optical pickup is the data recorded area or the data unrecorded area, according to whether or not a sync code is periodically detected from a signal read from the optical disc when detecting the data unrecorded area, thereby performing highly-accurate detection of the data unrecorded area. Further, it can speedily control generation of the data sync clock on the basis of detection of the data unrecorded area, when the position of data recording by the optical pickup shifts between the data unrecorded area and the data recorded area.

Further, according to the present invention (claim 7), the optical disc device as defined in claim 3 further comprises a sync code detector for detecting a sync code from the data read from the optical disc; and a data sync state detector for detecting whether the sync code detected by the sync code detector is inputted for every constant data length or not, by using the data sync clock, outputting a detection result indicating that a signal is being read from an area where data are recorded, when the sync code is inputted for every constant data length, and outputting a detection result indicating that a signal is being read from an area where data are not recorded, when the sync code is not inputted for every constant data length.

The optical disc device according to claim 7 of the present invention judges whether the area where data are being read by the optical pickup is the data recorded area or the data unrecorded area, according to whether or not a sync code is periodically detected from a signal read from the optical disc when detecting the data unrecorded area, thereby performing highly-accurate detection of the data unrecorded area. Further, it can speedily control generation of the data sync clock on the basis of detection of the data unrecorded area, when the position of data recording by the optical pickup shifts between the data unrecorded area and the data recorded area.

Further, according to the present invention (claim 8), the optical disc device as defined in claim 4 further comprises a sync code detector for detecting a sync code from the data read from the optical disc; and a data sync state detector for detecting whether the sync code detected by the sync code detector is inputted for every constant data length or not, by using the data sync clock, outputting a detection result indicating that a signal is being read from an area where data are recorded, when the sync code is inputted for every constant data length, and outputting a detection result indicating that a signal is being read from an area where data are not recorded, when the sync code is not inputted for every constant data length.

The optical disc device according to claim 8 of the present. invention judges whether the area where data are being read by the optical pickup is the data recorded area or the data unrecorded area, according to whether or not a sync code is periodically detected from a signal read from the optical disc when detecting the data unrecorded area, thereby performing highly-accurate detection of the data unrecorded area. Further, it can speedily control generation of the data sync clock on the basis of detection of the data unrecorded area, when the position of data recording by the optical pickup shifts between the data unrecorded area and the data recorded area.

EMBODIMENTS OF THE INVENTION

An optical disc device according to the present invention is provided with a clock control unit which judges whether a position in which data are being read by an optical pickup is in a data unrecorded area or a data recorded area, and outputs a judgement result as a clock control signal for controlling generation of a data sync clock.

(Embodiment 1)

Hereinafter, an optical disc device according to the first embodiment of the invention will be described.

Figure 1:
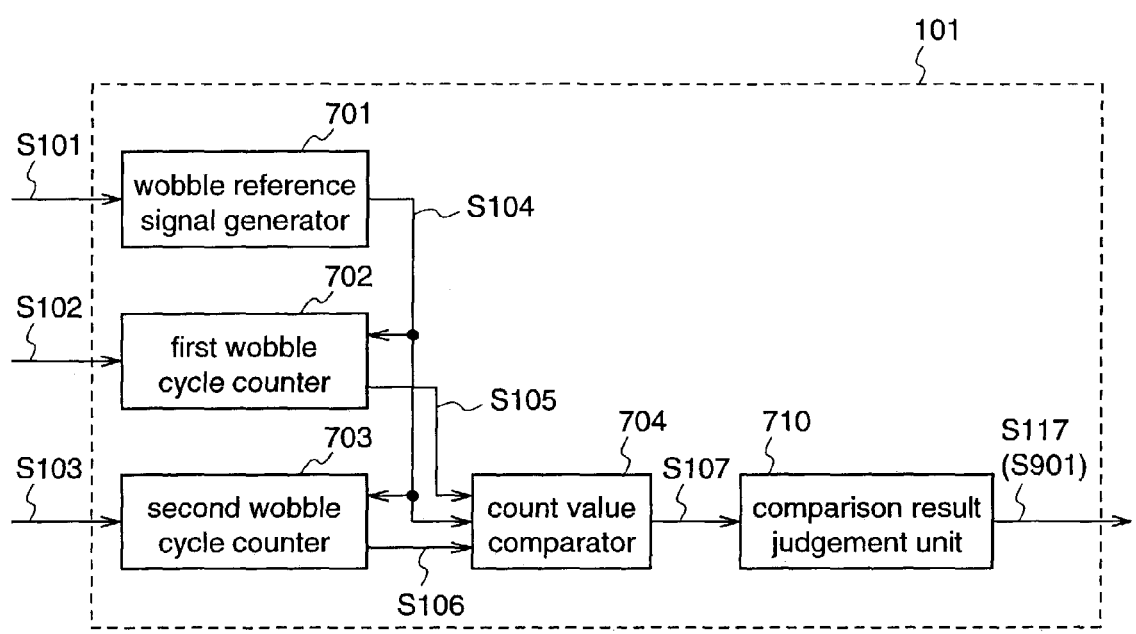
FIG. 1 is a block diagram illustrating the construction of a clock control unit included in an optical disc device according to a first embodiment of the present invention.

FIG. 1 is a block diagram illustrating the construction of a clock control unit 101 included in an optical disc device according to the first embodiment. The clock control unit 101 shown in FIG. 1 is provided with a wobble reference signal generator 701, a first wobble cycle counter 702, a second wobble cycle counter 703, a count value comparator 704, and a comparison result judgement unit 710. The wobble reference signal generator 701 receives a wobble signal S101, and generates a wobble reference signal S104 that is synchronized with the wobble signal S101. The wobble signal S101 is a signal that is extracted from an output signal of the optical pickup by the wobble signal detector, as described for the conventional example. The first wobble cycle counter 702 counts a constant cycle clock S102 which is supplied at regular intervals from the outside, during a period of the wobble reference signal S104, and outputs a counting result as a first wobble cycle signal S105. The second wobble cycle counter 703 counts the data sync clock S103 during the period of the wobble reference signal S104, and outputs the counting result as a second wobble cycle count signal S106. The data sync clock S103 is a sync clock that is generated on the basis of the RF envelope signal by the PLL circuit, as described for the conventional example. The count value comparator 704 compares the first wobble cycle count signal S105 and the second wobble cycle count signal S106, and outputs a count value comparison result S107. The comparison result judgement unit 710 judges whether or not the value of the count value comparison result S107 is within a range of values which have previously been set, and outputs the judgement result as a comparison result judgement signal S117. The range of values to be previously set is determined as follows. For example, an upper limit and a lower limit of a cycle that can be taken by a stable data sync clock S103 are set, and a difference between the second wobble cycle count signal S106 and the first wobble cycle count signal S105 is obtained for each of the cases where the data sync clock S103 has the cycle of the upper limit and the cycle of the lower limit, respectively, and a range having the obtained results as an upper limit and a lower limit is set.

Figure 8:
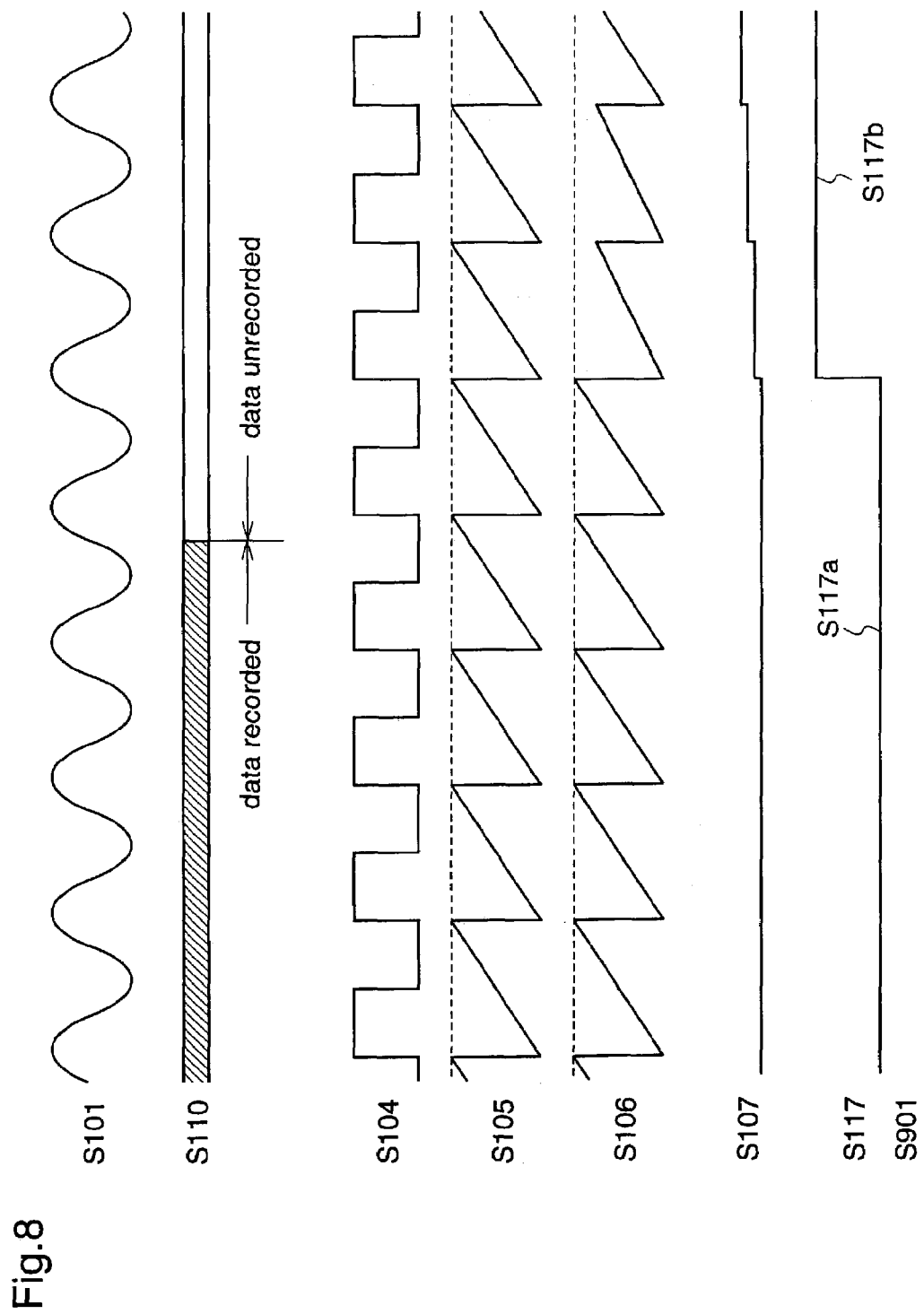
FIG. 8 is a diagram for explaining the operation of the clock control unit included in the optical disc device according to the first embodiment of the present invention.

FIG. 8 is a diagram schematically illustrating signals to be treated in the clock control unit 101, wherein the same reference numerals as those shown in FIG. 1 denote the same or corresponding signals. In FIG. 8, the vertical axes of waveforms of the first wobble cycle count signal S105 and the second wobble cycle count signal S106 indicate the count values.

Hereinafter, the operation of the clock control unit 101 will be described. Initially, the wobble reference signal generator 701 generates, from the wobble signal S101, a wobble reference signal S104 whose cycle corresponds to the cycle of the wobble signal S101.

Next, the first wobble cycle counter 702 counts the cycle of the wobble reference signal S104 with the constant cycle clock S102 to generates a first wobble cycle count signal S105, and outputs it to the count value comparator 704.

Next, the second wobble cycle counter 703 counts the cycle of the wobble reference signal S104 with the data sync clock S103 to generate a second wobble cycle count signal S106, and outputs it to the count value comparator 704.

The count value comparator 704 compares the first wobble cycle signal S105 and the second wobble cycle signal S106 for every cycle of the wobble reference signal S104 to obtain a difference between them, and outputs the difference as a count value comparison result S107.

When the optical pickup is reading data from the data recorded area of the optical disc, the cycle of the data sync clock S103 is stable. Further, the cycle of the constant cycle clock S102 is also constant. Furthermore, the first wobble cycle count signal S105 and the second wobble cycle count signal S106 are the results of counting the same wobble reference signal S104 with the data sync clock S103 and the constant cycle clock S102, respectively. Accordingly, at this time, the count value comparison result S107 indicating a difference between the first wobble cycle count signal S105 and the second wobble cycle count signal S106 becomes a stable value that is almost constant according to the cycle of the wobble sync signal.

On the other hand, when the optical pickup is reading data from the data unrecorded area of the optical disc, the data sync clock S103 fluctuates. Therefore, the count value comparison result S107 indicating a difference between the first wobble cycle count signal S105 and the second wobble cycle count signal S106 significantly fluctuates in accordance with the fluctuation of the data sync clock S103 to have a value that is different from the value obtained in the period during which the data sync clock S103 is stable, i.e., the period during which data are read from the data recorded area.

On receipt of the count value comparison result S107, the comparison result judgement unit 710 judges whether or not the value of the count value comparison result S107 is within the above-described range of the preset values. Since the data sync clock S103 significantly fluctuates from the original clock during the period in which data are being read from the data unrecorded area, the value of the count value comparison result S107 is out of the above-mentioned range. On the other hand, since the data sync clock is stable during the period in which data are being read from the data recorded area, the value of the count value comparison result S107 is within the above-mentioned range. When the value of the count value comparison result S107 is within the above-mentioned range, the comparison result judgement unit 710 judges that data are being read from the data recorded area by the optical pickup, and outputs a comparison result judgement signal S117a in the Low state, as shown in FIG. 8. Further, when the value of the count value comparison result S107 is out of the above-mentioned range, the comparison result judgement unit 710 judges that data are being read from the data unrecorded area by the optical pickup, and outputs a comparison result judgement signal S117b in the High state, as shown in FIG. 8. The comparison result judgement signal S117a and the comparison result judgement signal S117b are input, as a clock control signal S901, to the charge pump controller 801 of the second PLL circuit 8 which is shown in the conventional example, i.e., the PLL circuit for generating the data sync clock S103.

Figure 6:
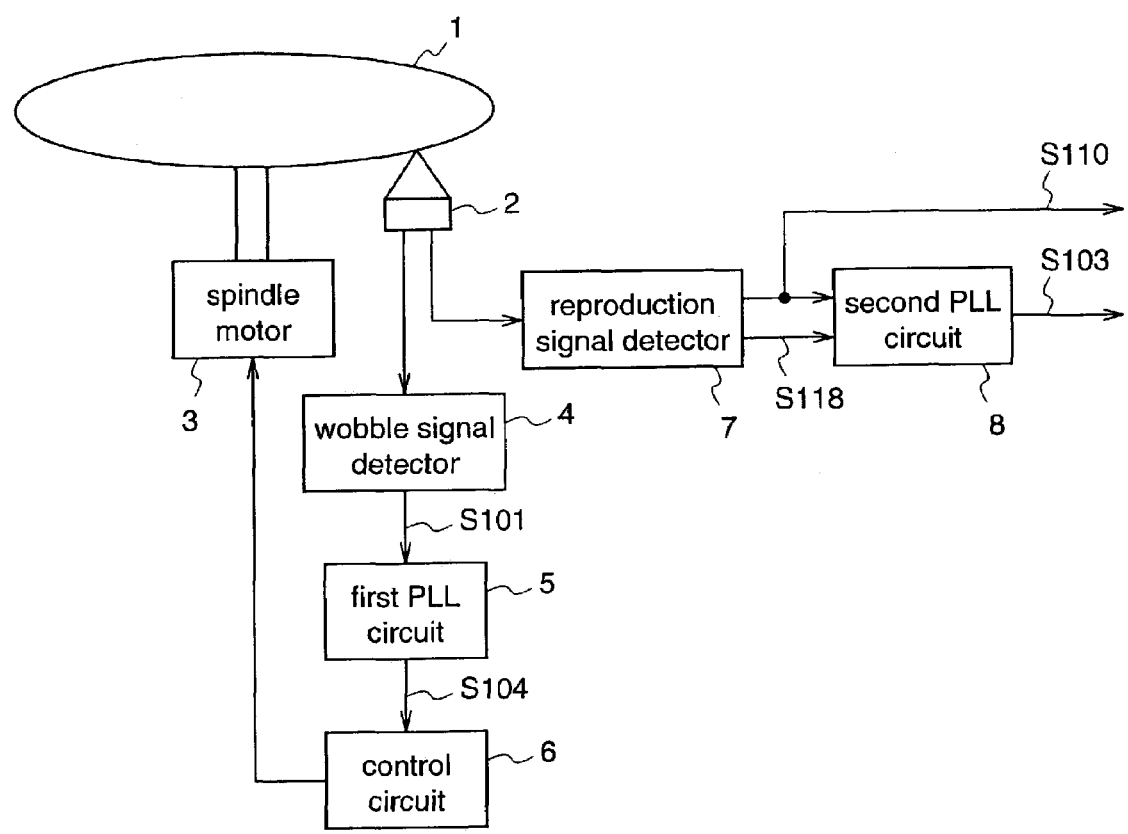
FIG. 6 is a block diagram illustrating the construction of a conventional optical disc device.
Figure 7:
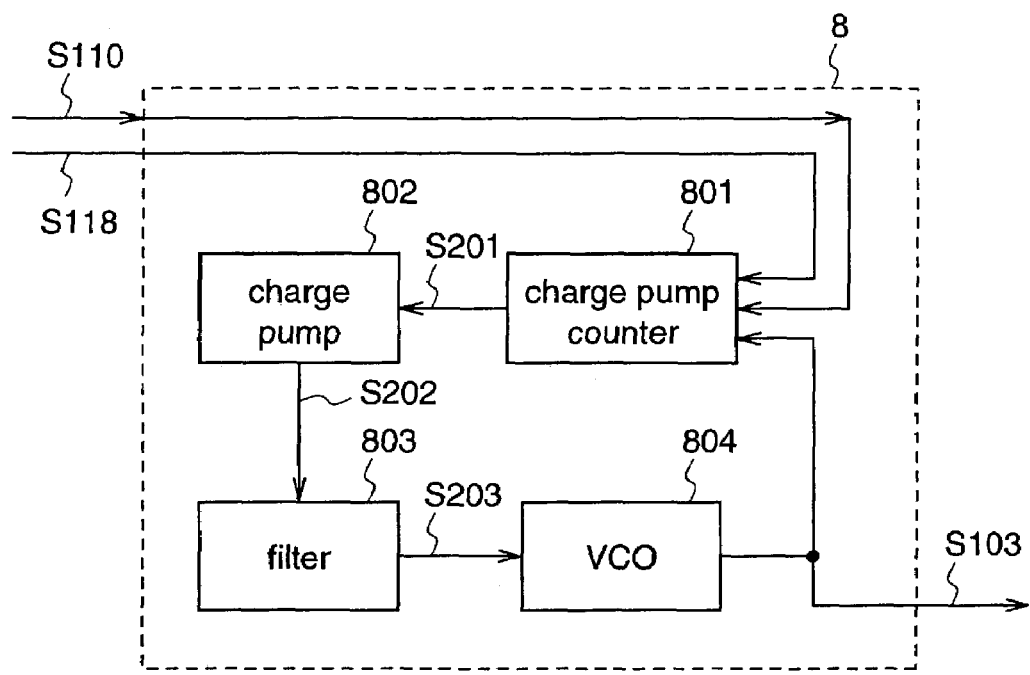
FIG. 7 is a block diagram illustrating the construction of a conventional PLL circuit.
Figure 13:
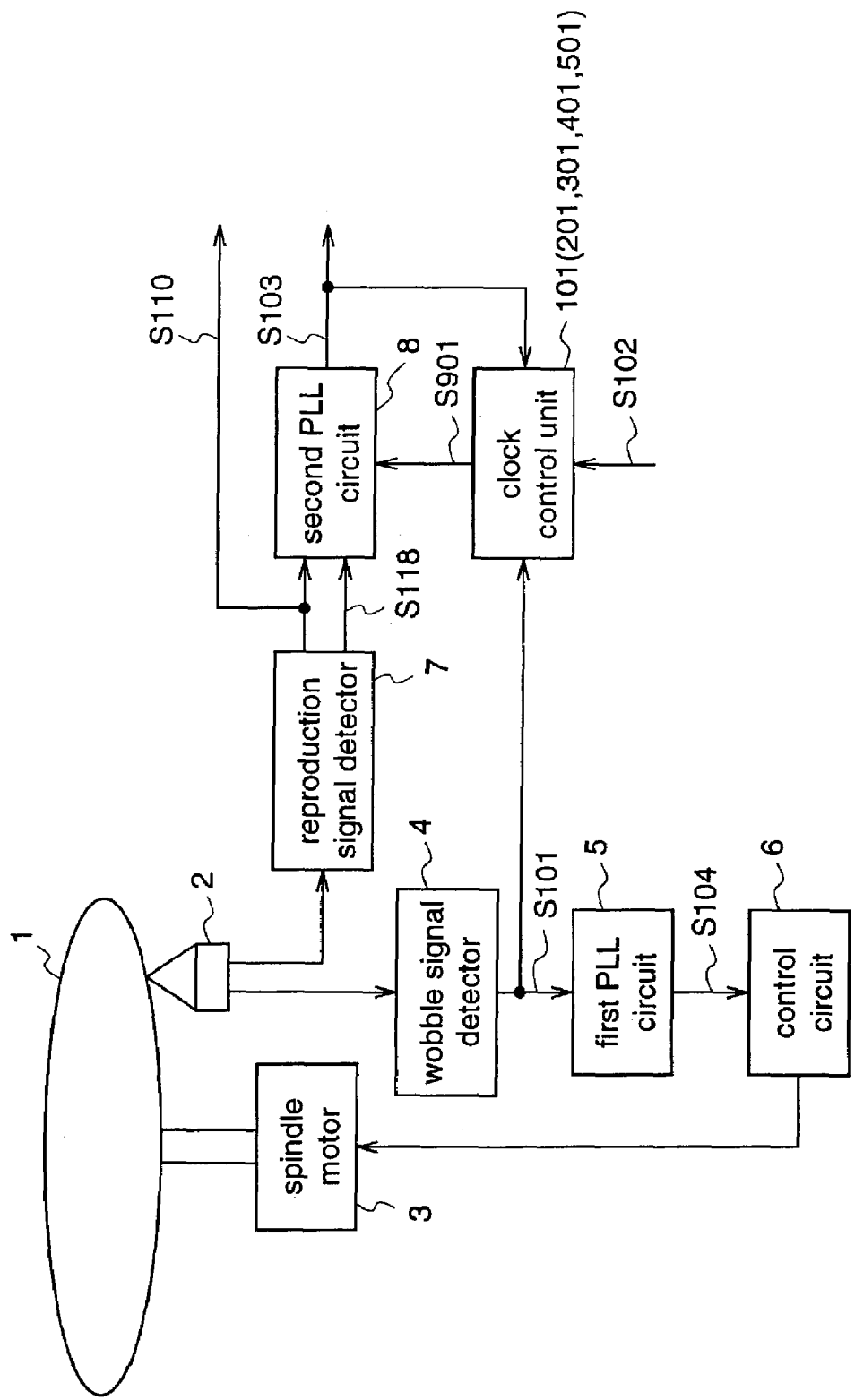
FIG. 13 is a block diagram illustrating the construction of an optical disc device according to any of the first to fifth embodiments of the present invention.

FIG. 13 is a block diagram illustrating an example of the whole structure of the optical disc device according to the first embodiment of the present invention. In FIG. 13, an optical disc device of the same structure as shown in FIG. 6 is further provided with the clock control unit 101.

Figure 14:
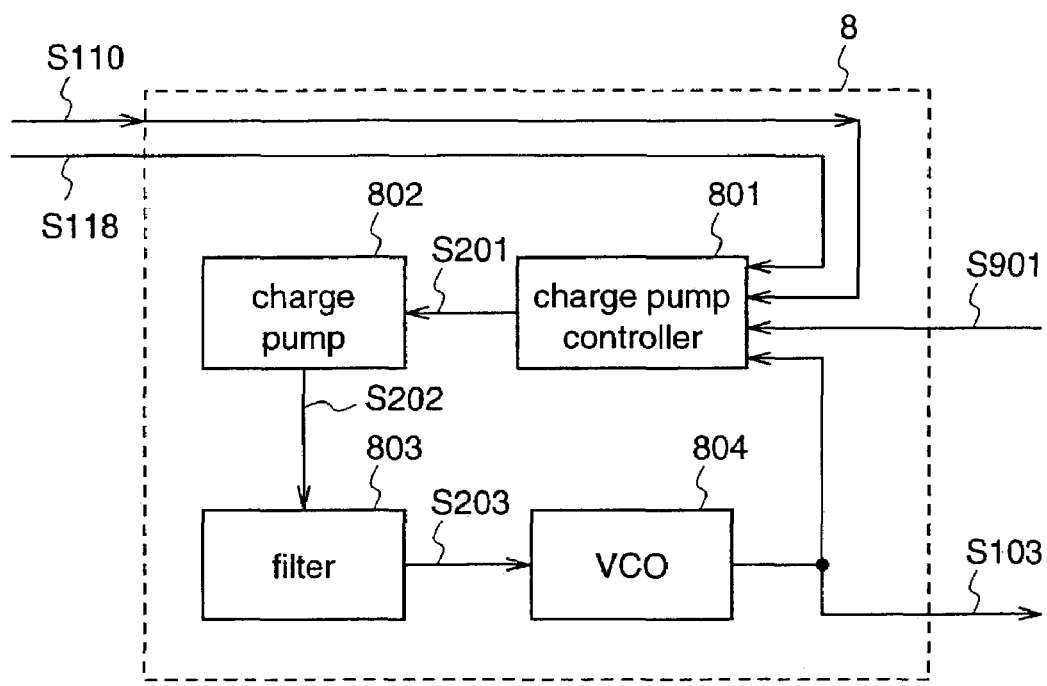
FIG. 14 is a block diagram illustrating the construction of a PLL circuit included in an optical disc device according to any of the first to fifth embodiments of the present invention.

FIG. 14 is a block diagram illustrating an example of the structure of the second PLL circuit 8 shown in FIG. 13.

Hereinafter, the operation of the second PLL circuit 8 with the clock control signal S901 will be described. When the second PLL circuit 8 receives the Low-state comparison result judgement signal S117a as a clock control signal S901, it outputs a data sync clock S103 whose phase and frequency are matched to the phase and frequency of the RF envelope signal S110. On the other hand, when the second PLL circuit 8 receives the High-state comparison result judgement signal S117b, the charge pump controller 801 generates a charge pump control signal S201 on the basis of the data sync clock S103 alone, which is output from the VCO 804, and outputs it to the charge pump 802, and the second PLL circuit 8 outputs the data sync clock S103 whose phase and frequency are not matched to the phase and frequency of the RF envelope signal S110. As described above, when data are being read from the data recorded area, the second PLL circuit 8 outputs the data sync clock S103 whose phase and frequency are matched to the phase and frequency of the RF envelope signal S110. On the other hand, when data are being read from the data unrecorded area, the second PLL circuit 8 outputs the data sync clock S103 whose phase and frequency are not matched to the phase and frequency of the RF envelope signal S110, i.e., with the state of the data sync clock S103 being maintained.

As described above, the optical disc device according to the first embodiment is provided with the clock control unit 101 which counts the same wobble reference signal S104 with the constant cycle clock S102 and the data sync clock S103, respectively, compares these count results to obtain a difference, judges as to whether the area from which data are being read by the optical pickup is the data recorded area or the data unrecorded area according to whether the count value comparison result is within a range of preset values or not, and outputs the judgement result as a clock control signal for controlling generation of the data sync clock. The data sync clock is generated on the basis of the clock control signal that is output from the clock control unit 101. Thereby, it can be accurately detected as to whether the area from which data are being read by the optical pickup is the data recorded area or the data unrecorded area, and generation of the data sync clock can be speedily controlled on the basis of the detection result when the position of data reading by the optical pickup shifts between the data unrecorded area and the data recorded area.

(Embodiment 2)

Hereinafter, an optical disc device according to a second embodiment of the present invention will be described.

Figure 2:
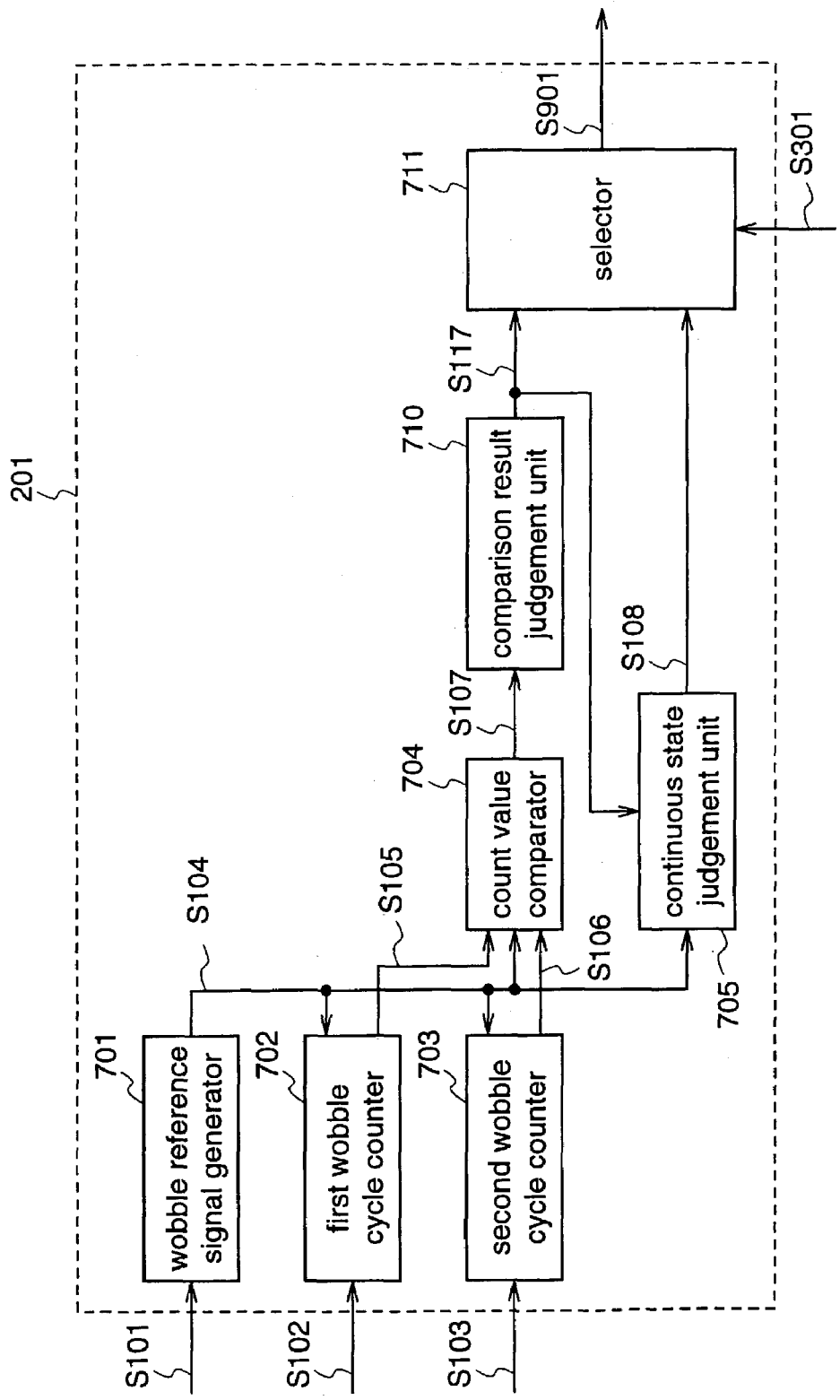
FIG. 2 is a block diagram illustrating the construction of a clock control unit included in an optical disc device according to a second embodiment of the present invention.

FIG. 2 is a block diagram illustrating the construction of a clock control unit 201 possessed by the optical disc device according to the second embodiment, wherein the same reference numerals as those shown in FIG. 1 denote the same or corresponding parts. The clock control unit 201 includes a continuous state judgement unit 705 and a selector 711 in addition to the components of the clock control unit 201. The continuous state judgement unit 705 receives the comparison result judgement signal S117 and the wobble reference signal S104, and holds the comparison result judgement signal S117 which is previous in time by a period equal to at least one cycle or longer of the wobble reference signal S104. Then, the continuous state judgement unit 705 compares the comparison result judgement signal S117 with the one cycle previous comparison result judgement signal S117, at every cycle of the wobble reference signal S104, and judges whether the comparison result judgement signal S117 continuously indicates the same state or not, and outputs the judgement result as a continuous state judgement result signal S108. The selector 711 determines whether the comparison result judgement signal S117 should be output as a clock control signal S901 in its Low state or in its High state, on the basis of the continuous state judgement result signal S108. The selector 711 performs the above-mentioned operation when it receives a permission control signal S301 from a controller (not shown) which controls the whole optical disc device.

Figure 9:
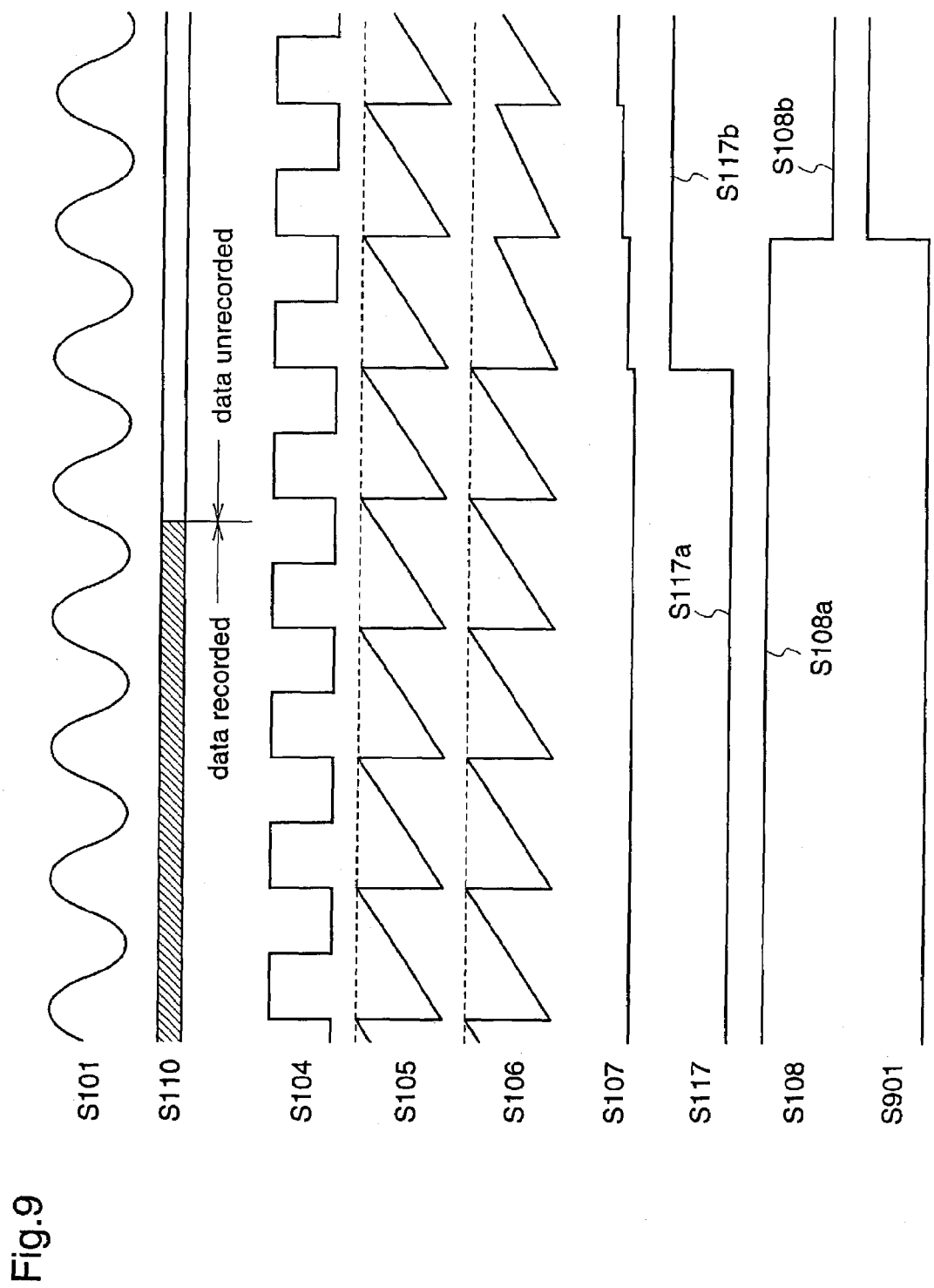
FIG. 9 is a diagram for explaining the operation of the clock control unit included in the optical disc device according to the second embodiment of the present invention.

FIG. 9 is a diagram schematically illustrating signals to be treated in the clock control unit 201, wherein the same reference numerals as those shown in FIGS. 2 and 8 denote the same or corresponding signals.

Hereinafter, the operation of the clock control unit 201 will be described. As for the same or similar components as/to those described for the first embodiment, the operations thereof will not be described repeatedly.

The continuous state judgement unit 705 compares the inputted comparison result judgement signal S117 with the one cycle previous comparison result judgement signal S117 that is stored in the continuous state judgement unit 705, at every cycle of the wobble reference signal S104, and judges the continuous states of these signals timewise, and outputs the judgement result as a continuous state judgement result signal S108. In the example shown in FIG. 9, when the comparison result judgement signal S117 indicates the same state continuously for two cycles of the wobble reference signal S104, the continuous state judgement result signal S108 is inverted from S108*a* to S108*b*. However, when the comparison result judgement signal S117 indicates that data are being read from the data unrecorded area for only a period corresponding to one cycle, due to temporary fluctuation or the like of the data sync clock S103, the continuous state judgement result signal S108 is not changed. Therefore, when the continuous state judgement result signal S108 is not changed, even if the comparison result judgement signal S117 indicates that data are being read from the data unrecorded area, this comparison result judgement signal S117 is judged to be an error as a signal indicating the detection result of the data unrecorded area. Accordingly, when the comparison result judgement signal S117 indicates the detection result of the data unrecorded area, it is possible to judge whether this detection result is caused by temporary fluctuation or the like of the data sync clock or by the optical pickup's reading data from the data unrecorded area of the optical disc, by checking the state of the continuous state judgement result signal S108. This judgement is carried out when the selector 711 receives the permission control signal S301 from the controller. When the selector 711 judges that the comparison result judgement signal S117 is not an error as a signal indicating the detection result of the data unrecorded area, it outputs the High-state comparison result judgement signal S117*b* as the clock control signal S901. When the selector 711 judges that the signal S117 is an error, it outputs the Low-state comparison result judgement signal S117*a* as the clock control signal S901. The clock control signal S901 is input to the PLL circuit for generating the data sync clock S103.

Since the operation of the PLL circuit with the clock control signal S901 is identical to that described for the first embodiment, repeated description is not necessary.

Further, since the whole construction of the optical disc device and the construction of the second PLL circuit according to the second embodiment are also identical to those described for the first embodiment, repeated description is not necessary.

As described above, the optical disc device according to the second embodiment is provided with the clock control unit 201 which further includes the continuous state judgement unit 705 and the selector 711, and the clock control unit 201 judges whether fluctuation of the comparison result judgement signal S117 is temporary or continuous, and outputs the clock control signal S901 on the basis of the judgement result. Therefore, detection errors due to temporary fluctuation of the comparison result judgement signal S117 are reduced, whereby the data unrecorded area can be detected with higher accuracy. Further, based on the detection result, generation of the data sync clock can be speedily controlled when the position of data reading by the optical pickup shifts between the data unrecorded area and the data recorded area.

(Embodiment 3)

Hereinafter, an optical disc device according to a third embodiment of the present invention will be described.

Figure 3:
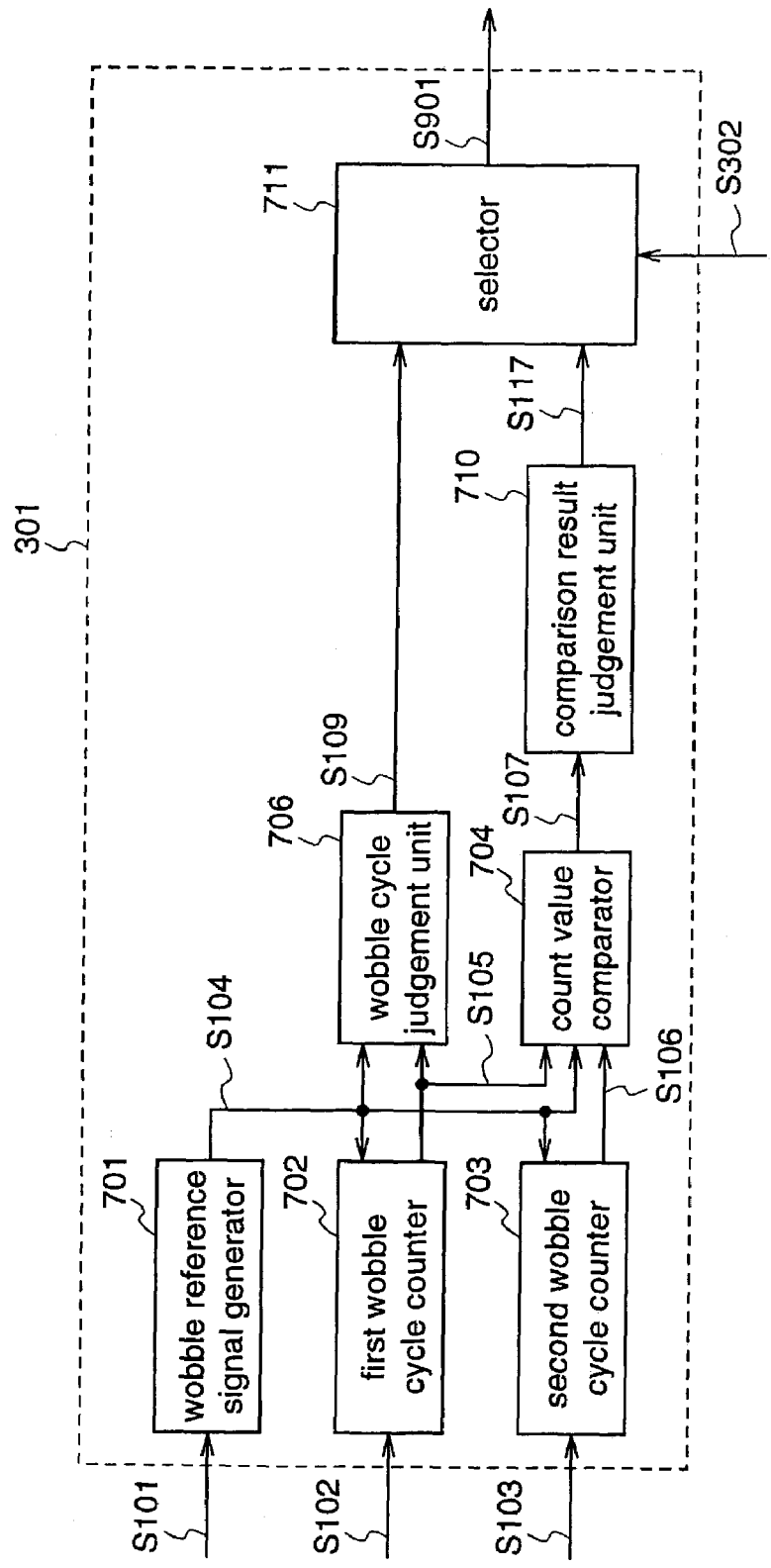
FIG. 3 is a block diagram illustrating the construction of a clock control unit included in an optical disc device according to a third embodiment of the present invention.

FIG. 3 is a block diagram illustrating the construction of a clock control unit 301 included in the optical disc device according to the third embodiment, wherein the same reference numerals as those shown in FIG. 1 denote the same or corresponding parts. The clock control unit 301 is provided with a wobble cycle judgement unit 706 and a selector 711 in addition to the components of the clock control unit 101. The wobble; cycle judgement unit 706 receives a wobble reference signal S104 and a first wobble cycle count signal S105, continuously judges whether or not the value of the first wobble cycle count signal S105 is within a range of preset values, for every cycle of the wobble reference signal S104, and outputs the judgement result as a wobble cycle judgement signal S109. As for the range of preset values, an upper limit and a lower limit of a cycle which can be taken by the wobble reference signal S104 that is regarded as being stable are counted with the constant cycle clock S102, and a range whose upper limit and lower limit are the values obtained by the count is set. Further, in the clock control unit 301, the selector 711 determines whether the comparison result judgement signal S117 should be output as a clock control signal S901 in its Low state or in its High state, on the basis of the wobble cycle judgement signal S109. The selector 711 performs the above-mentioned operation when it receives a permission control signal S302 from a controller (not shown) which controls the whole optical disc device.

Figure 10:
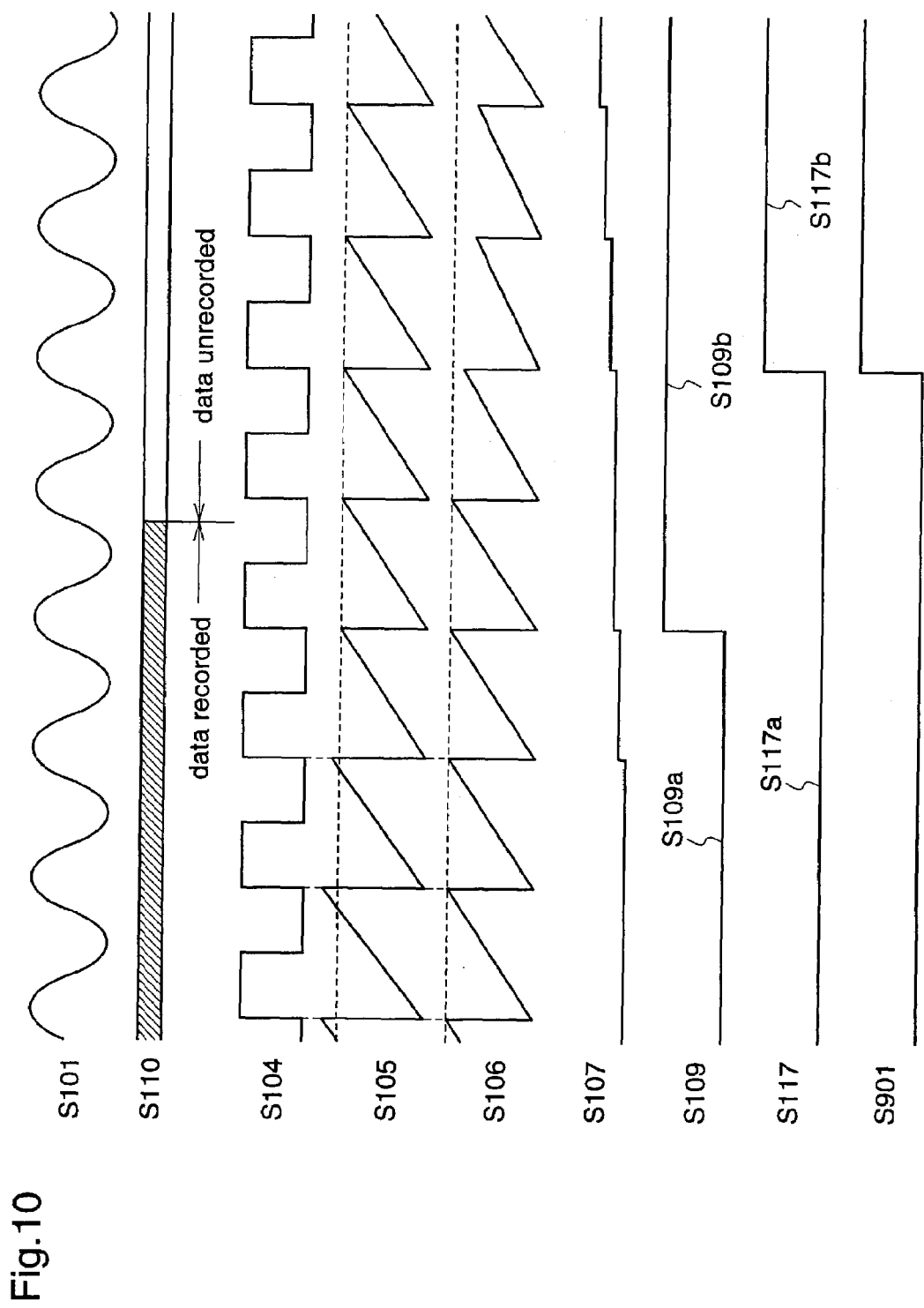
FIG. 10 is a diagram for explaining the operation of the clock control unit included in the optical disc device according to the third embodiment of the present invention.

FIG. 10 is a diagram schematically illustrating signals to be treated in the clock control unit 301, wherein the same reference numerals as those shown in FIGS. 3 and 9 denote the same or corresponding signals.

Hereinafter, the operation of the clock control unit 301 will be described. As for the same or similar components as/to those described for the second embodiment, the operations thereof will not repeatedly be described.

The wobble cycle judgement unit 706 continuously checks whether the inputted first wobble cycle count signal S105 is within the above-mentioned range or not, for every cycle of the wobble reference signal S104. Since the first wobble cycle count signal S105 is stable when it is continuously within the above-mentioned range, the wobble cycle judgement unit 706 judges that the wobble reference signal S104 is stable, and outputs a wobble cycle judgement signal S109a indicating that the wobble reference signal S104 is stable. On the other hand, when the first wobble cycle count signal S105 is out of the above-mentioned range, the wobble cycle judgement unit 706 judges that the first wobble cycle count signal S105 significantly fluctuates, and outputs a wobble cycle judgement signal S109b indicating that the wobble reference signal S104 is not stable. Therefore, when the wobble cycle judgement signal S109 does not indicate that the wobble reference signal S104 is not stable, even if the comparison result judgement signal S117 indicates that data are being read from the data unrecorded area, this comparison result judgement signal S117 is judged to be an error as a signal indicating the detection result of the data unrecorded area. This judgement is carried out when the selector 711 receives the permission control signal S302 from the controller. When the selector 711 judges that the comparison result judgement signal S117 is not an error as a signal indicating the detection result of the data unrecorded area, it outputs the High-state comparison result judgement signal S117b as the clock control signal S901. When the selector 711 judges that the signal S117 is an error, it outputs the Low-state comparison result judgement signal S117a as the clock control signal S901. The clock control signal S901 is input to the PLL circuit for generating the data sync clock S103.

Since the operation of the PLL circuit with the clock control signal S901 is identical to that described for the first embodiment, repeated description is not necessary.

Further, since the whole construction of the optical disc device and the construction of the second PLL circuit according to the third embodiment are also identical to those described for the first embodiment, repeated description is not necessary.

As described above, the optical disc device according to the third embodiment is provided with the clock control unit 301 which further includes the wobble cycle judgement unit 706 and the selector 711, and the clock control unit 301 judges whether the wobble reference signal S104 is stable or not, according to whether the first wobble cycle count signal S105 continuously takes values within a predetermined range or not, and outputs the clock control signal S901 according to the judgement result. Therefore, when detecting the data unrecorded area, judgement errors due to fluctuation of the wobble reference signal S104 are reduced, whereby the data unrecorded area can be detected with higher accuracy. Further, based on the detection result, generation of the data sync clock can be speedily controlled when the position of data reading by the optical pickup shifts between the data unrecorded area and the data recorded area.

(Embodiment 4)

Hereinafter, an optical disc device according to a fourth embodiment of the present invention will be described.

Figure 4:
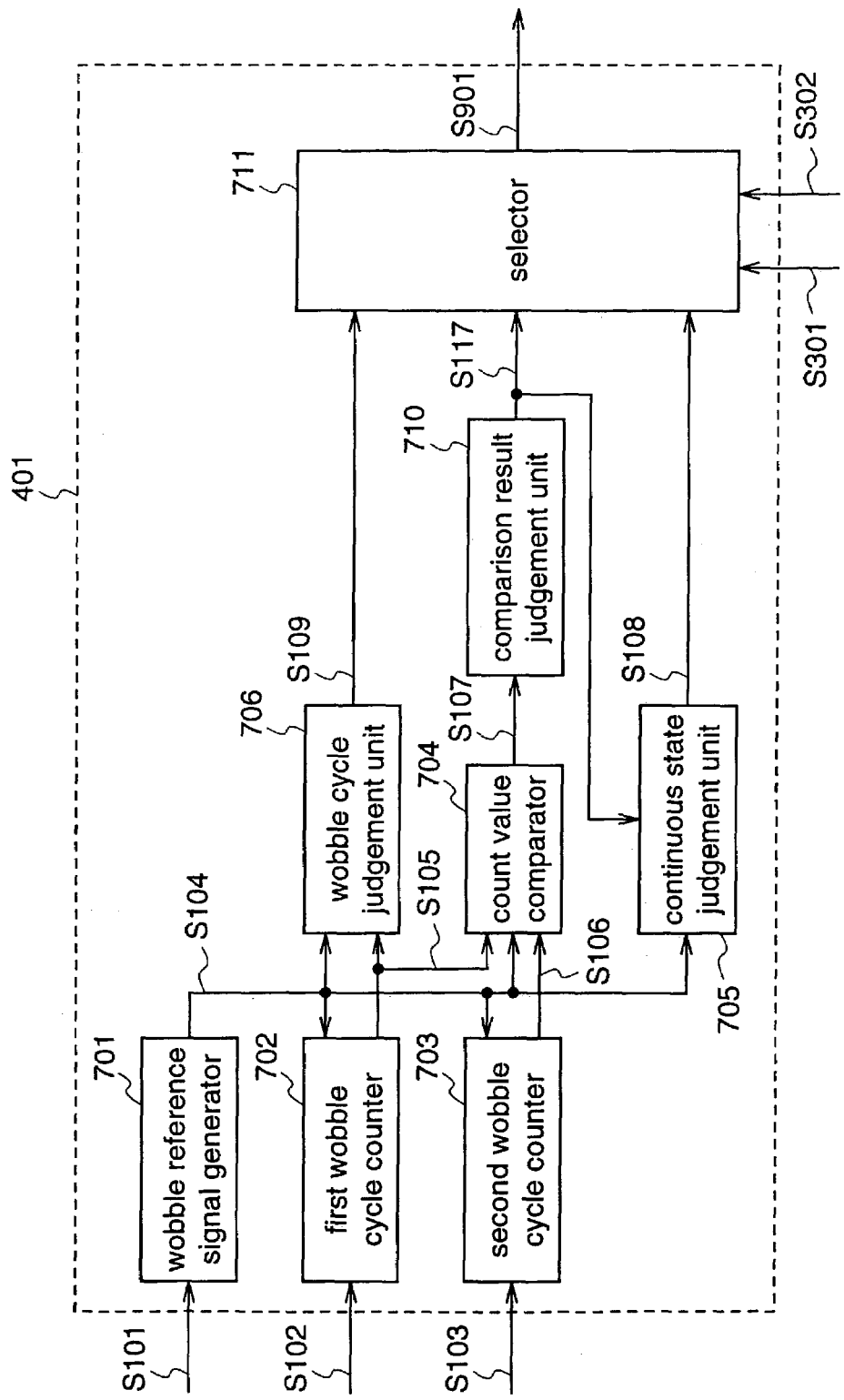
FIG. 4 is a block diagram illustrating the construction of a clock control unit included in an optical disc device according to a fourth embodiment of the present invention.
Figure 11:
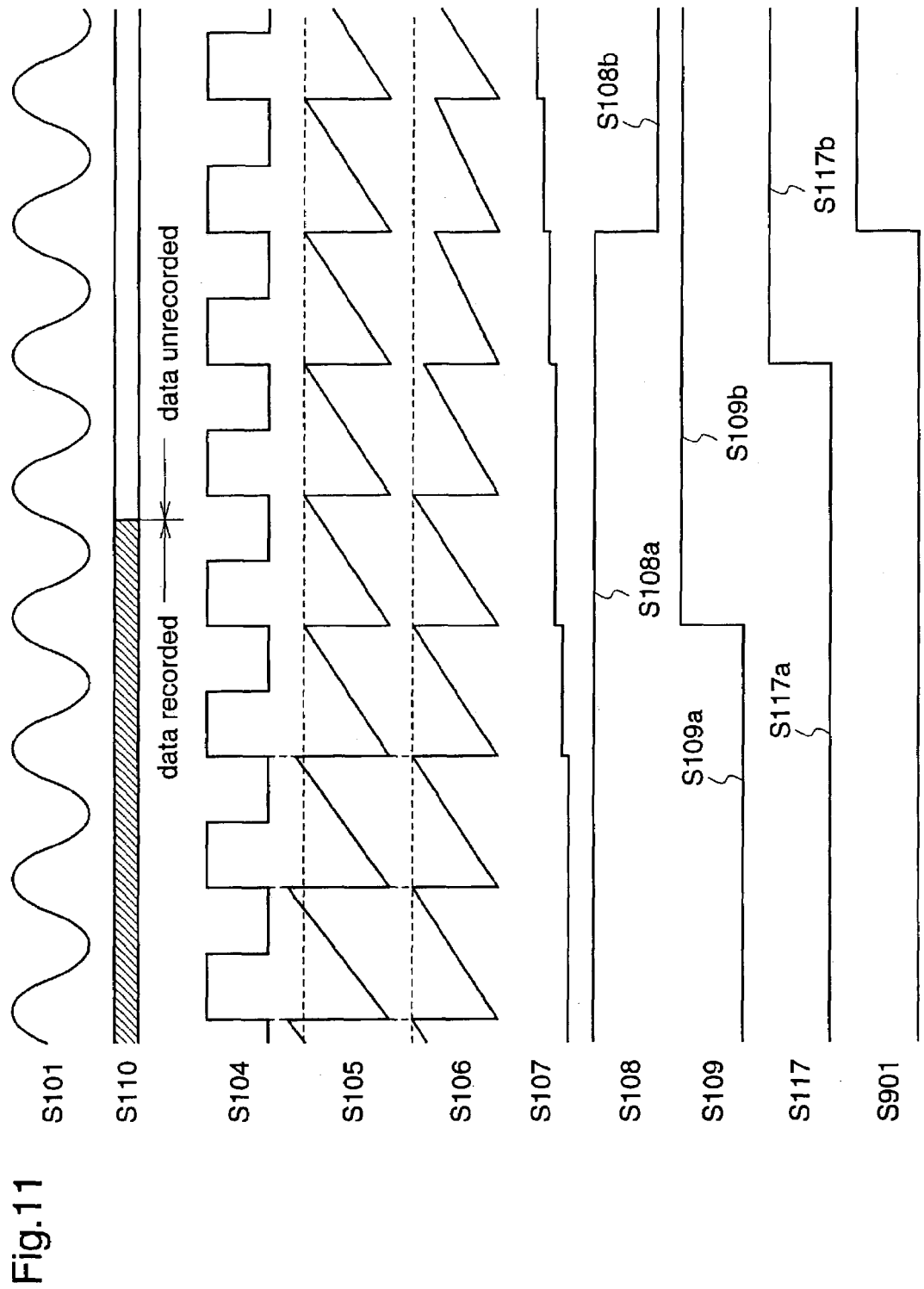
FIG. 11 is a diagram for explaining the operation of the clock control unit included in the optical disc device according to the fourth embodiment of the present invention.

FIG. 4 is a block diagram illustrating the construction of a clock control unit 401 possessed by the optical disc device according to the fourth embodiment, wherein the same reference numerals as those shown in FIGS. 2 and 3 denote the same or corresponding parts. Further, FIG. 11 is a diagram schematically illustrating signals to be treated in the clock control unit 401, wherein the same reference numerals as those shown in FIGS. 4 and 10 denote the same or corresponding signals.

The clock control unit 401 includes a wobble cycle judgement unit 706 in addition to the components of the clock control unit 201. In the clock control unit 401, the selector 711 receives a permission control signal S301 and a permission control signal S302 from the controller. On receipt of these two permission control signals from the controller, the selector 711 judges whether or not the comparison result judgement signal S117 is an error as a signal indicating the detection result of the data unrecorded area, on the basis of the continuous state judgement result signal S108 and the wobble cycle judgement signal S109. For example, when the continuous state judgement result signal S108 is not changed, even if the comparison result judgement signal S117 indicates that data are being read from the data unrecorded area, this comparison result judgement signal S117 is judged to be an error as a signal indicating the detection result of the data unrecorded area. Further, when the wobble cycle judgement signal S109 indicates that the wobble reference signal S104 is not stable, even if the comparison result judgement signal S117 indicates that data are being read from the data unrecorded area, this comparison result judgement signal S117 is judged to be an error as a signal indicating the detection result of the data unrecorded area. On the other hand, the selector 711 judges that the comparison result judgement signal S117 is not an error as a signal indicating the detection result of the data unrecorded area, when the comparison result judgement signal S117 indicates that data are being read from the data unrecorded area, the continuous state judgement result signal S108 is changed, and the wobble cycle judgement signal S109 indicates that the wobble reference signal S104 is stable. When the selector 711 judges that the comparison result judgement signal S117 is not an error as a signal indicating the detection result of the data unrecorded area, it outputs the High-state comparison result judgement signal S117b as the clock control signal S901. When the selector 711 judges that the comparison result judgement signal S117 is an error, it outputs the Low-state comparison result judgement signal S117a as the clock control signal S901. The clock control signal S901 is input to the PLL circuit for generating the data sync clock.

Since the operation of the second PLL circuit 8 with the clock control signal S901 is identical to that described for the first embodiment, repeated description is not necessary.

Further, since the whole construction of the optical disc device and the construction of the second PLL circuit according to the fourth embodiment are also identical to those described for the first embodiment, repeated description is not necessary.

As described above, the optical disc device according to the fourth embodiment is provided with the clock control unit 401 which includes the continuous state judgement unit 705, the wobble cycle judgement unit, and the selector 711 in addition to the components of the clock control unit 101, and the clock control unit 401 judges whether the state indicated by the comparison result judgement signal S117 is caused by temporary fluctuation or not, from the change of the comparison result judgement signal S117 with time. Further, the clock control unit 401 judges whether the wobble reference signal S104 is stable or not, according to whether the first wobble cycle count signal S105 continuously takes values within the predetermined range or not, and outputs the clock control signal S901 based on the detection result. Therefore, when detecting the data unrecorded area, judgement errors due to temporary fluctuation of the wobble reference signal S104 are reduced, and judgement errors due to fluctuation of the wobble reference signal S104 are reduced, resulting in highly accurate detection of the data unrecorded area. Further, based on the detection result, generation of the data sync clock can be speedily controlled when the position of data reading by the optical pickup shifts between the data unrecorded area and the data recorded area.

While in this fourth embodiment the selector 711 receives both of the permission control signal S301 and the permission control signal S302, the selector 711 may receive either the permission control signal S301 or the permission control signal S302 to operate according to the inputted permission control signal.

(Embodiment 5)

Hereinafter, an optical disc device according to a fifth embodiment of the present invention will be described.

Figure 5:
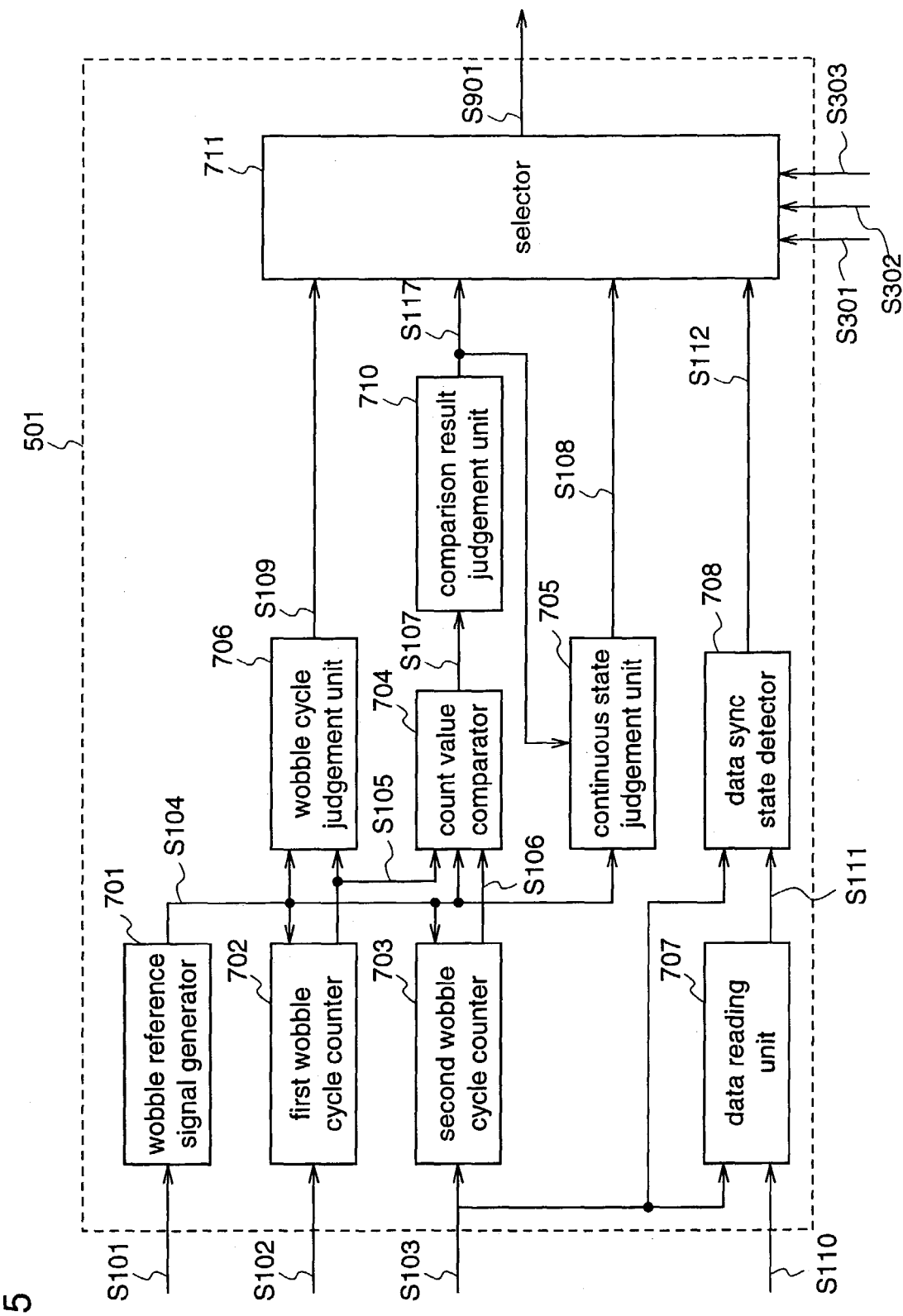
FIG. 5 is a block diagram illustrating the construction of a clock control unit included in an optical disc device according to a fifth embodiment of the present invention.

FIG. 5 is a block diagram illustrating the construction of a clock control unit 501 possessed by the optical disc device according to the fifth embodiment, wherein the same reference numerals as those shown in FIG. 4 denote the same or corresponding parts. The clock control unit 501 includes a data reading unit 707 and a data sync state detector 708 in addition to the components of the clock control unit 401. The data reading unit 707 receives an RF envelope signal S110 and a data sync clock S103, and detects a data sync code from the RF envelope signal S110 on the basis of the data sync clock S103, thereby generating a data sync code detection signal S111 indicating the timing at which the data sync code is detected. The data sync state detector 708 detects whether the data sync code is inputted for every predetermined data length or not, from the data sync code detection signal S111, by using the data sync clock S103, and outputs the detection result as a data sync state detection result signal S112.

Further, in the clock control unit 501, the selector 711 receives a permission control signal S301, a permission control signal S302, and a permission control signal S303 from a controller (not shown) for controlling the whole optical disc device. On receipt of the three permission control signals, the selector 711 judges whether or not the comparison result judgement signal S117 is an error as a signal indicating the detection result of the data unrecorded area, on the basis of the continuous state judgement result signal S108, the wobble cycle judgement signal S109, and the data sync state detection result signal S112. Then, based on the judgement result, the selector 711 determines whether the comparison result judgement signal S117 should be output as a clock control signal S901 in its Low state or in its High state.

Figure 12:
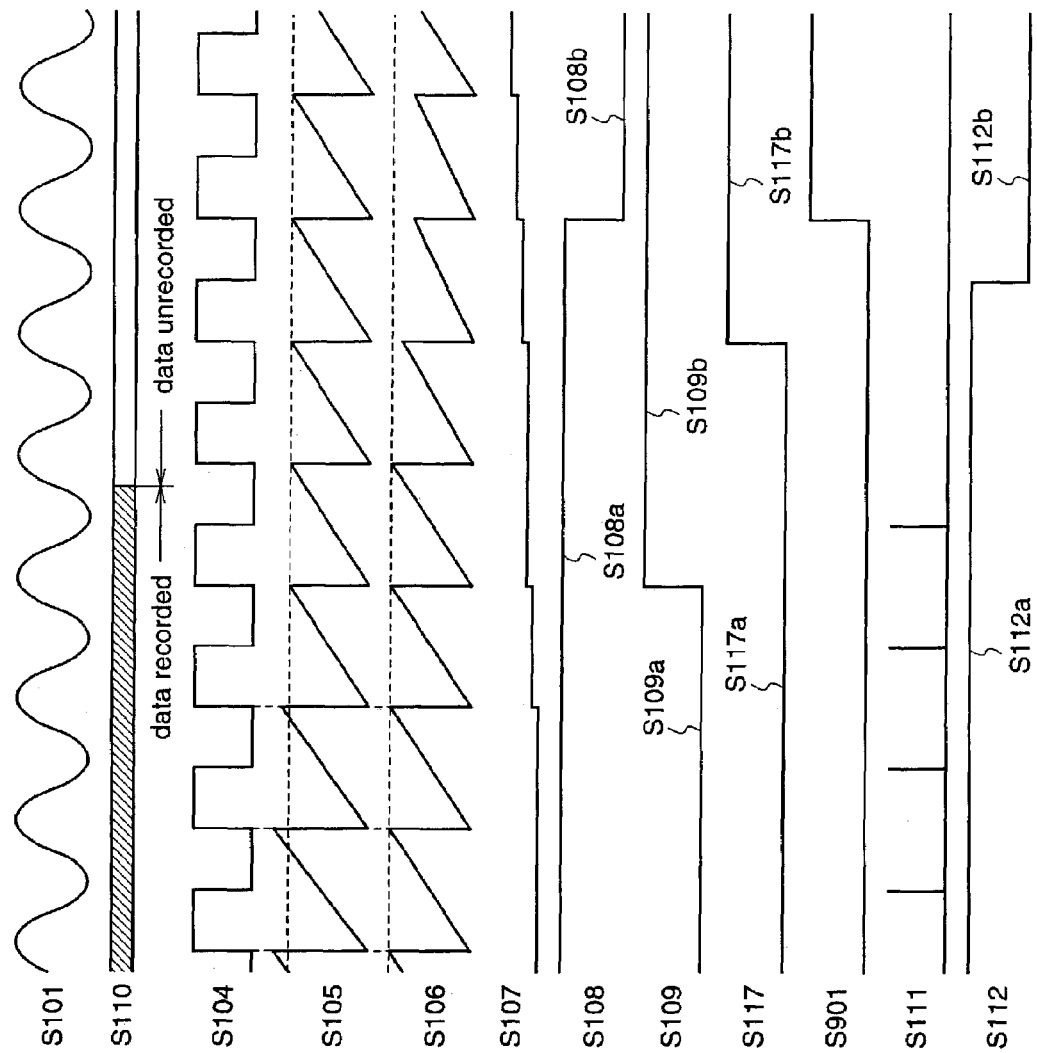
FIG. 12 is a diagram for explaining the operation of the clock control unit included in the optical disc device according to the fifth embodiment of the present invention.

FIG. 12 is a diagram schematically illustrating signals to be treated in the clock control unit 501, wherein the same reference numerals as those shown in FIGS. 5 and 11 denote the same or corresponding signals.

Hereinafter, the operation of the clock control unit 501 will be described. As for the same or similar components as/to those described for the fourth embodiment, the operations thereof will not be described repeatedly.

On receipt of the RF envelope signal S110, the data reading unit 707 detects a sync code in data, with the data sync clock S103 as an operation clock, and generates a data sync code detection signal S111 indicating the timing at which a data sync code as sown in FIG. 12 is detected. The data sync state detector 708 reads the data sync code detection signal 111 with the data sync clock S103, and detects whether the detection timing of the data sync code indicated by the data sync code detection signal S111 is periodic or not, thereby detecting that the data sync code is inputted for every predetermined data length. Then, the data sync state detector 708 outputs the detection result as a data sync state detection result signal S112 as shown in FIG. 12. In FIG. 12, the data sync state detection result signal S112 changes from S112a to S112b at the timing when the data sync code becomes undetectable for every predetermined data length. Since the sync code is periodically recorded on the data recorded area of the optical disc, if the signal read from the optical disc is one read from the data recorded area, the sync code is periodically included in the read signal. Therefore, it is possible to judge whether the area from which data are being read by the optical pickup is the data recorded area or not, by detecting whether the sync code is periodically detected or not, on the basis of the data sync code detection signal S111.

On receipt of the three permission control signals S301, S302, and S303, the selector 711 judges whether or not the comparison result judgement signal S117 is an error as a signal indicating the detection result of the data unrecorded area, on the basis of the continuous state judgement result signal S108, the wobble cycle judgement signal S109, and the data sync state detection result signal S112. For example, when the continuous state judgement result signal S108 is not changed, even if the comparison result judgement signal S117 indicates that data are being read from the data unrecorded area, this comparison result judgement signal S117 is judged to be an error as a signal indicating the detection result of the data unrecorded area. Further, when the wobble cycle judgement signal S109 indicates that the wobble reference signal S104 is not stable, even if the comparison result judgement signal S117 indicates that data are being read from the data unrecorded area, this comparison result judgement signal S117 is judged to be an error as a signal indicating the detection result of the data unrecorded area. Further, when the data sync state detection result signal S112 indicates that the sync code is periodically detected, even if the comparison result judgement signal S117 indicates that data are being read from the data unrecorded area, this comparison result judgement signal S117 is judged to be an error as a signal indicating the detection result of the data unrecorded-area. On the other hand, the selector 711 judges that the comparison result judgement signal S117 is not an error as a signal indicating the detection result of the data unrecorded area, when the comparison result judgement signal S117 indicates that data are being read from the data unrecorded area, the continuous state judgement result signal S108 is changed, the wobble cycle judgement signal S109 indicates that the wobble reference signal S104 is stable, and the data sync state detection result signal S112 indicates that the sync code is not periodically detected. When the selector 711 judges that the comparison result detection signal S117 is not an error as a signal indicating the detection result of the data unrecorded area, it outputs the High-state comparison result judgement signal S117b as the clock control signal S901. When the selector 711 judges that the comparison result detection signal S117 is an error, it outputs the Low-state comparison result judgement signal S117a as the clock control signal S901. The clock control signal S901 is input to the PLL circuit for generating the data sync clock.

Since the operation of the second PLL circuit 8 with the clock control signal S901 is identical to that described for the first embodiment, repeated description is not necessary.

Further, since the whole construction of the optical disc device according to the fifth embodiment and the construction of the second PLL circuit are identical to those described for the first embodiment, repeated description is not necessary.

As described above, the optical disc device according to the fifth embodiment is provided with the clock control unit 501 which includes, in addition to the components of the clock control unit 201, the continuous state judgement unit 705, the wobble cycle judgement unit 706, the selector 711, the data reading unit 707 for detecting a sync code from the RF envelope signal S110, and the data sync state detector 708 for detecting whether the sync code is periodically detected for every predetermined data length or not. This clock control unit 501 judges whether the area from which data are being read by the optical pickup is the data recorded area or the data unrecorded data, according to whether the state indicated by the comparison result judgement signal S117 is caused by temporary fluctuation or not, whether the wobble reference signal S104 is stable or not, and whether the sync code is periodically detected from the signal read from the optical disc or not, and the clock control unit 501 outputs the clock control signal on the basis of the judgement result. Therefore, the clock control unit 501 can detect the data unrecorded area with higher accuracy by using the plural judgement results. Further, based on the detection result, the clock control unit 501 can speedily control generation of the data sync clock when the position of data reading by the optical pickup shifts between the data unrecorded area and the data recorded area.

While in this fifth embodiment the selector 711 receives the permission control signal S301, the permission control signal S302, and the permission control signal S303, the selector 711 may receive at least one of these three permission control signals to operate according to the inputted permission control signal.

Furthermore, the optical disc device according to the present invention may be constructed such that the first PLL circuit 5, the second PLL circuit 8, and the wobble reference signal generator 701 are implemented by a single circuit, whereby the circuit scale can be reduced.

The invention claimed is:

1. An optical disc device comprising:
    a first wobble cycle counter for receiving a wobble reference signal that is synchronized with a wobble signal obtained from wobbles on tracks of an optical disc, and a clock of a constant cycle, and counting the cycle of the wobble reference signal with the constant-cycle clock;
    a second wobble cycle counter for receiving the wobble reference signals, and a data sync clock that is synchronized with data obtained from the optical disc, and counting the cycle of the wobble reference signal with the data sync clock;
    a comparator for deriving a difference between a count value outputted from the first wobble cycle counter and a count value outputted from the second wobble cycle counter; and
    a comparison result judgement unit for judging whether the difference of the count values obtained by the comparator is within a range of preset values or not, and outputting a judgement result indicating whether the data sync clock fluctuates or not.

2. An optical disc device as defined in claim 1 further comprising a continuous state judgement unit for comparing the judgement results outputted from the comparison result judgement unit, at every continuous cycle of the wobble reference signal, to judge whether the judgement result outputted from the comparison result judgement unit is a temporary one or a continuous one.

3. An optical disc device as defined in claim 1 further comprising a wobble cycle judgement unit for comparing the count values outputted from the first wobble cycle counter, at every continuous cycle of the wobble reference signal, to detect whether the wobble reference signal fluctuates or not.

4. An optical disc device as defined in claim 2 further comprising a wobble cycle judgement unit for comparing the count values outputted from the first wobble cycle counter, at every continuous cycle of the continuous wobble reference signal, to detect whether the wobble reference signal fluctuates or not.

5. An optical disc device as defined in claim 1 further comprising:
    a sync code detector for detecting a sync code from the data read from the optical disc; and
    a data sync state detector for
        detecting whether the sync code detected by the sync code detector is inputted for every constant data length or not, by using the data sync clock,
        outputting a detection result indicating that a signal is being read from an area where data are recorded, when the sync code is inputted for every constant data length, and
        outputting a detection result indicating that a signal is being read from an area where data are not recorded, when the sync code is not inputted for every constant data length.

6. An optical disc device as defined in claim 2 further comprising:
    a sync code detector for detecting a sync code from the data read from the optical disc; and
    a data sync state detector for
        detecting whether the sync code detected by the sync code detector is inputted for every constant data length or not, by using the data sync clock,
        outputting a detection result indicating that a signal is being read from an area where data are recorded, when the sync code is inputted for every constant data length, and
        outputting a detection result indicating that a signal is being read from an area where data are not recorded, when the sync code is not inputted for every constant data length.

7. An optical disc device as defined in claim 3 further comprising:
    a sync code detector for detecting a sync code from the data read from the optical disc; and
    a data sync state detector for
        detecting whether the sync code detected by the sync code detector is inputted for every constant data length or not, by using the data sync clock,
        outputting a detection result indicating that a signal is being read from an area where data are recorded, when the sync code is inputted for every constant data length, and
        outputting a detection result indicating that a signal is being read from an area where data are not recorded, when the sync code is not inputted for every constant data length.

8. An optical disc device as defined in claim 4 further comprising:
    a sync code detector for detecting a sync code from the data read from the optical disc; and
    a data sync state detector for
        detecting whether the sync code detected by the sync code detector is inputted for every constant data length or not, by using the data sync clock,
        outputting a detection result indicating that a signal is being read from an area where data are recorded, when the sync code is inputted for every constant data length, and
        outputting a detection result indicating that a signal is being read from an area where data are not recorded, when the sync code is not inputted for every constant data length.

* * * * *